(12) United States Patent
Ohara et al.

(10) Patent No.: US 11,635,472 B2
(45) Date of Patent: Apr. 25, 2023

(54) LOAD DRIVING DEVICE

(71) Applicant: HITACHI AUTOMOTIVE SYSTEMS, LTD., Hitachinaka (JP)

(72) Inventors: Yuri Ohara, Hitachinaka (JP); Yasushi Sugiyama, Hitachinaka (JP); Takeo Yamashita, Hitachinaka (JP); Masahiro Doi, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 399 days.

(21) Appl. No.: 17/054,973

(22) PCT Filed: Feb. 14, 2019

(86) PCT No.: PCT/JP2019/005219
§ 371 (c)(1),
(2) Date: Nov. 12, 2020

(87) PCT Pub. No.: WO2019/220716
PCT Pub. Date: Nov. 21, 2019

(65) Prior Publication Data
US 2021/0218360 A1 Jul. 15, 2021

(30) Foreign Application Priority Data

May 16, 2018 (JP) .............................. JP2018-094299

(51) Int. Cl.
*B60W 20/00* (2016.01)
*G01R 31/50* (2020.01)
(Continued)

(52) U.S. Cl.
CPC ............. *G01R 31/50* (2020.01); *B60W 20/50* (2013.01); *B60W 50/0205* (2013.01); *H02P 29/024* (2013.01); *B60W 2050/021* (2013.01)

(58) Field of Classification Search
CPC ....... G01R 31/50; G01R 31/40; B60W 20/50; B60W 50/0205; B60W 2050/021;
(Continued)

(56) References Cited

U.S. PATENT DOCUMENTS 9,099,894 B2 * 8/2015 Azancot ................. H02J 50/40
2012/0249037 A1 10/2012 Iwamiya
(Continued)

FOREIGN PATENT DOCUMENTS

JP H08-75811 A 3/1996
JP 2011-53175 A 3/2011
(Continued)

OTHER PUBLICATIONS

International Search Report with English translation and Written Opinion issued in corresponding application No. PCT/JP2019/005219 dated May 21, 2019.

*Primary Examiner* — Ian Jen
(74) *Attorney, Agent, or Firm* — Foley & Lardner LLP

(57) ABSTRACT

A load driving device includes a synchronous rectifier circuit having a driving-side switching element and a reflux-side switching element; a driver control circuit controls the synchronous rectifier circuit; and a voltage monitor circuit that monitors whether the voltage of an output terminal of the synchronous rectifier circuit is within a predetermined voltage range; where the driver control circuit, upon receiving a diagnosis command, performs control so that when the driving-side switching element is switched from ON to OFF, the reflux-Side switching element is also switched to OFF; and the voltage monitor circuit detects a normal state when the voltage to be monitored is within a normal level during a period in which both the driving-side switching element and the reflux-side switching element are turned OFF.

13 Claims, 11 Drawing Sheets

(51) Int. Cl.
*B60W 20/50* (2016.01)
*B60W 50/02* (2012.01)
*H02P 29/024* (2016.01)

(58) Field of Classification Search
CPC .......... H02P 29/024; H02P 7/29; Y02B 70/10; H02H 3/00; H02M 1/32; H02M 3/1588
See application file for complete search history.

(56) References Cited

U.S. PATENT DOCUMENTS

2014/0340095 A1  11/2014  Schneider
2015/0311956 A1* 10/2015  Azancot .............. H02J 7/00045
                                                    307/104

FOREIGN PATENT DOCUMENTS

| JP | 2012-143048 A | 7/2012 |
| JP | 2012-222855 A | 11/2012 |
| JP | 2013-236483 A | 11/2013 |
| JP | 2014-239571 A | 12/2014 |

* cited by examiner

LOAD DRIVING DEVICE

TECHNICAL FIELD

The present invention relates to a load driving device including a synchronous rectifier circuit.

BACKGROUND ART

There is a case where detection of sky failure, earth failure, and disconnection is required as abnormality detection in the load driving device, and in automobiles in particular, it is required to enable detection of abnormalities under a wide range of driving conditions due to problems of fuel efficiency and safety issues. As a disconnection detection in a synchronous rectifier circuit which is one system of a circuit for driving a load, there is a method of detecting a current flowing through the synchronous rectifier circuit and determining a disconnection when no current is flowing. However, at the time of driving with a low Duty ratio, a low power supply voltage, or the like, the current flowing through the synchronous rectifier circuit may not reach the accuracy of current detection, in which case, there is a risk of false detection as a disconnection.

As a conventional technique that enables disconnection detection under such a low current condition, there is a method of turning ON/OFF the driving-side switching element while keeping the reflux-side switching element in the OFF state to detect the presence or absence of a pulse of the output voltage, and determining disconnection. For example, PTL 1 describes stopping the synchronous rectification operation for a fixed time for every constant cycle, performing pulse driving with a fixed duty by the driving switching element during the stop period, and determining disconnection depending on whether or not a pulse-shaped voltage signal is output to the output terminal of the driving switching element.

CITATION LIST

Patent Literature

PTL 1: JP 2012-143048 A

SUMMARY OF INVENTION

Technical Problem

The conventional method requires at least one cycle of diagnostic time for pulse detection, which causes a problem of longer diagnostic time.

Solution to Problem

A load driving device according to the present invention includes a synchronous rectifier circuit having a driving-side switching element and a reflux-side switching element; a driver control circuit that controls the synchronous rectifier circuit; and a voltage monitor circuit that monitors the voltage of an output terminal of the synchronous rectifier circuit; where the driver control circuit, upon receiving a diagnosis command, performs control so that when the driving-side switching element is switched from ON to OFF, the reflux-side switching element is also switched to OFF; and the voltage monitor circuit detects a normal state when the voltage to be monitored is within a predetermined voltage range during a period in which both the driving-side switching element and the reflux-side switching element are turned OFF.

Advantageous Effects of Invention

According to the present invention, whether the output side of the synchronous rectifier circuit is in a disconnection state or a normal state can be detected in a short time during driving with a low load current.

DESCRIPTION OF EMBODIMENTS

First Embodiment

Figure 1:
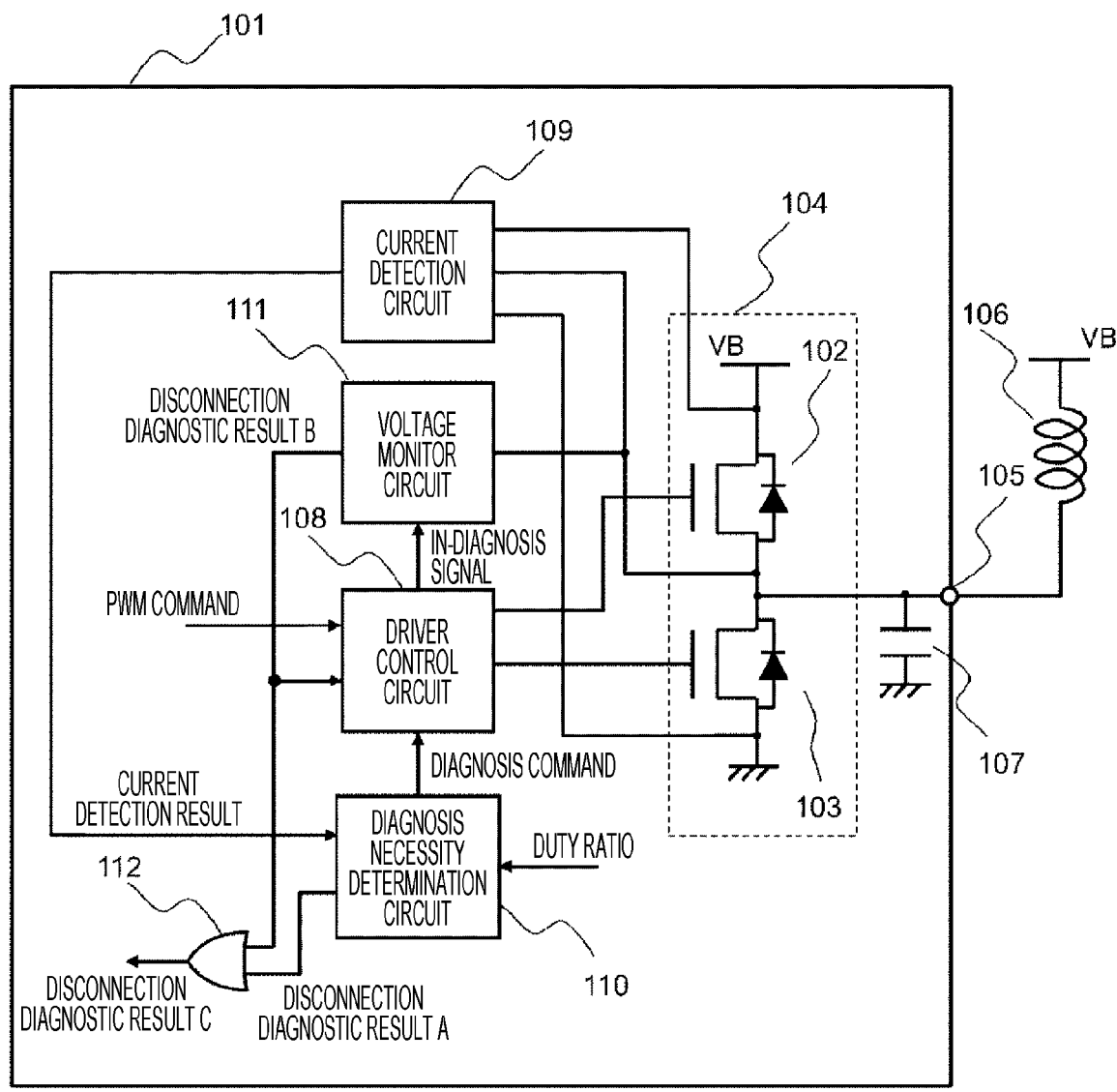
FIG. 1 is a circuit configuration diagram in a first embodiment.

FIG. 1 shows a circuit configuration diagram in the present embodiment.

A load driving device 101 includes a synchronous rectifier circuit 104 formed by a high-side FET 102 and a low-side FET 103. An inductive load 106 and a terminal capacitor 107 are connected to a synchronous rectifier circuit output terminal 105 of the synchronous rectifier circuit 104. In the present embodiment, since the synchronous rectifier circuit 104 has a low-side configuration in which the load 106 is connected to a power supply voltage VB, the high-side FET 102 serves as a reflux-side switching element and the low-side FET 103 serves as a driving-side switching element. The terminal capacitor 107 has a role of protecting the synchronous rectifier circuit 104 from a surge from the outside.

A driver control circuit 108 turns ON/OFF the high-side FET 102 and the low-side FET 103 by controlling the respective gate voltages according to the input PWM command.

A current detection circuit 109 detects the current flowing through the synchronous rectifier circuit 104 and inputs the detection result to a diagnosis necessity determination circuit 110.

The diagnosis necessity determination circuit 110 compares the Duty ratio of PWM control input from a microcomputer or the like and the current detection result of the current detection circuit 109 with a threshold value, respectively, and outputs a disconnection diagnostic result A to an OR gate 112 and a diagnosis command to the driver control circuit 108 based on the comparison result.

When the driver control circuit 108 detects that the diagnosis command has become H (High), the driver control circuit 108 shifts to a diagnostic mode, which will be described later, and outputs an in-diagnosis signal to the voltage monitor circuit 111 as H in the diagnostic mode.

The voltage monitor circuit 111 monitors the voltage of the synchronous rectifier circuit output terminal 105 in the diagnostic mode, and outputs a disconnection diagnostic result B to the OR gate 112 and the driver control circuit 108 based on the comparison result with the voltage threshold value set between the power supply voltage VB and the GND voltage.

When either one of the disconnection diagnostic result A and the disconnection diagnostic result B is the H signal indicating the disconnection, the OR gate 112 sets the state of the synchronous rectifier circuit output terminal 105 to the disconnection state and outputs a disconnection diagnostic result C as H.

Figure 2:
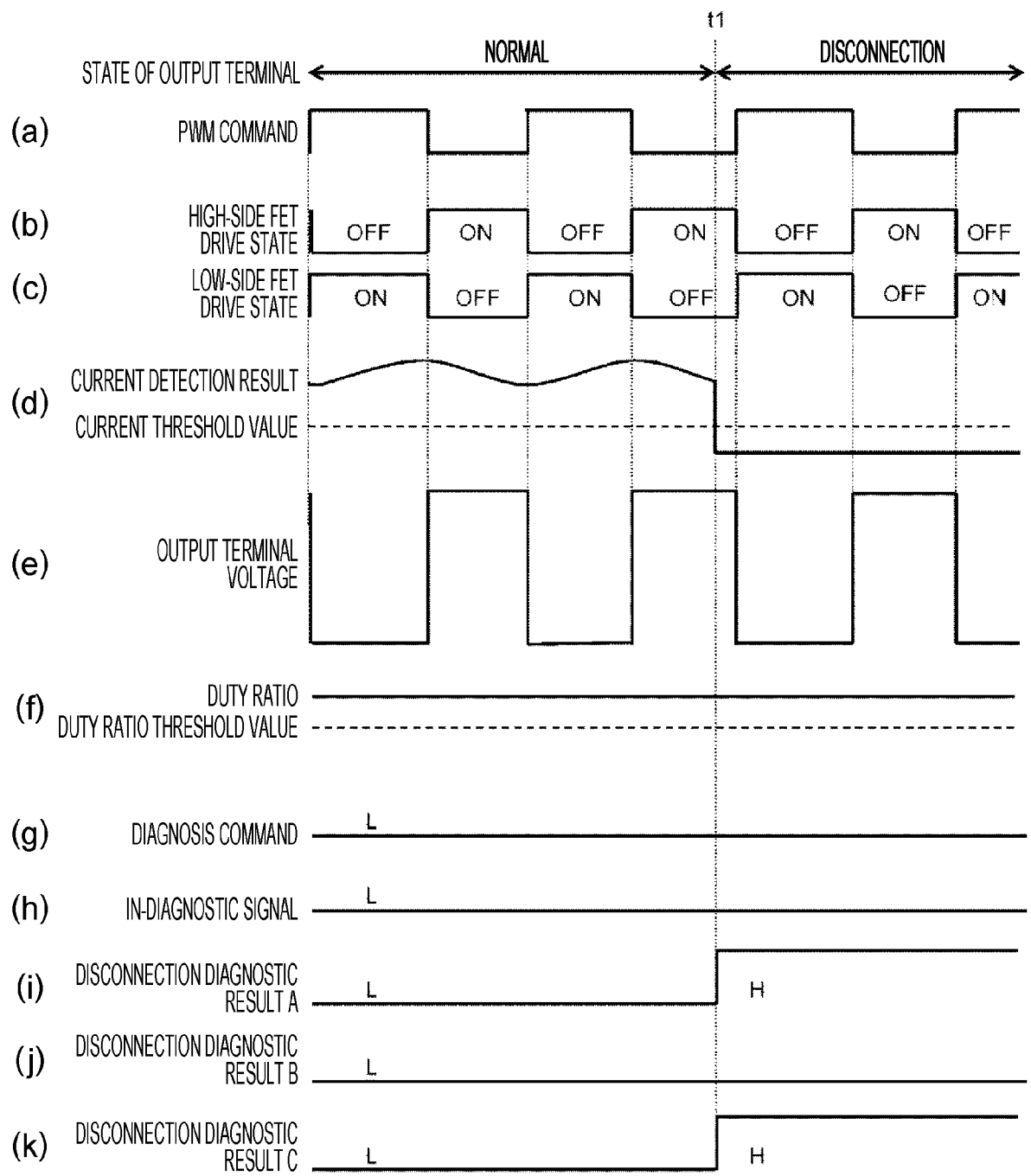
FIG. 2 is a timing chart showing an example of an operation when the Duty ratio is high in the first embodiment.

FIG. 2 is a timing chart showing an example of the operation when the Duty ratio is high in the present embodiment. Specifically, this is an example of a case where the Duty ratio is greater than the Duty ratio threshold value.

In normal control, the driver control circuit 108 alternately turns ON/OFF the high-side FET 102 and the low-side FET 103 in accordance with the PWM command to perform the PWM control. When the PWM command shown in FIG. 2(a) is H, the high-side FET 102 is controlled to be OFF as shown in FIG. 2(b), and the low-side FET 103 is controlled to be ON as shown in FIG. 2(c). When the PWM command shown in FIG. 2(a) is L, the high-side FET 102 is controlled to be ON and the low-side FET 103 is controlled to be OFF.

As shown in FIG. 2(f), when the Duty ratio is higher than the Duty ratio threshold value, the state of the synchronous rectifier circuit output terminal 105 is determined by the diagnosis necessity determination circuit 110 based on only the current detection result of the current detection circuit 109 shown in FIG. 2(d). Therefore, the diagnosis necessity determination circuit 110 always outputs the diagnosis command shown in FIG. 2(g) as L.

When the current detection result of the current detection circuit 109 is larger than the current threshold value, the diagnosis necessity determination circuit 110 outputs the disconnection diagnostic result A as L as a normal state as shown in FIG. 2(i). On the other hand, at time t1, when the current detection result of the current detection circuit 109 is smaller than the current threshold value, the disconnection diagnostic result A shown in FIG. 2(i) is output as H as a disconnection state. As a result, as shown in FIG. 2(k), the OR gate 112 outputs the disconnection diagnostic result C as H as a disconnection state.

At this time, the Duty ratio threshold value is set to a value the current flowing through the synchronous rectifier circuit 104 always becomes higher than the current threshold value when the synchronous rectifier circuit output terminal 105 is in a normal connection state and is driven at a Duty ratio greater than or equal to Duty ratio threshold value, so that the state of the load 106 can be reliably determined only by the current threshold value.

As described above, the disconnection diagnosis is performed by using only the current detection result of the current detection circuit 109 when the Duty ratio is high, so that the disconnection diagnosis is performed only by the normal control without shifting the control of the synchronous rectifier circuit 104 to the disconnection diagnostic mode.

Figure 3:
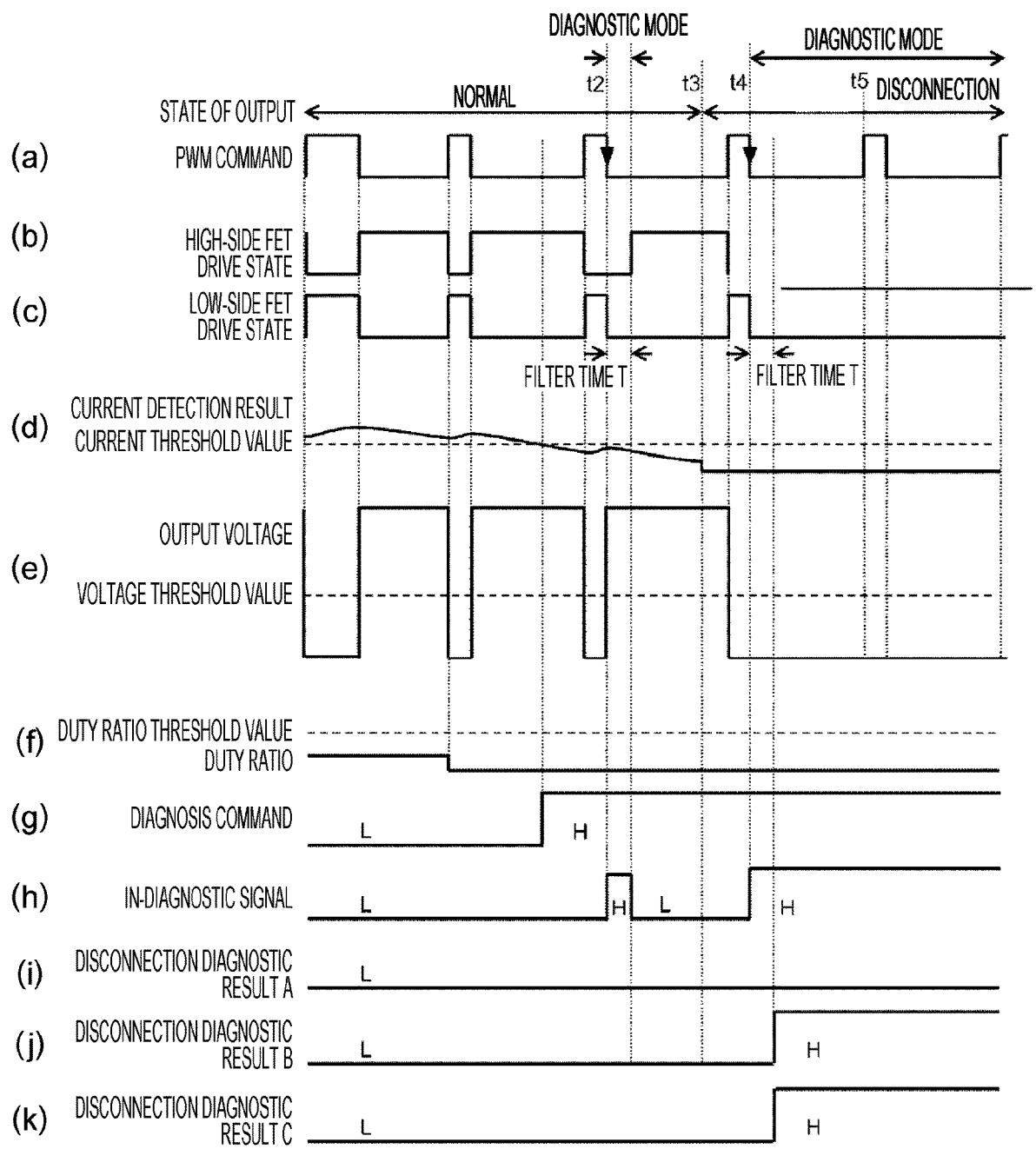
FIG. 3 is a timing chart showing an example of an operation when the Duty ratio is low in the first embodiment.

FIG. 3 is a timing chart showing an example of the operation when the Duty ratio is low in the present embodiment. Specifically, this is an example of a case where the Duty ratio is less than or equal to the Duty ratio threshold value.

When the current detection result of the current detection circuit 109 shown in FIG. 3(d) is less than or equal to the current threshold value, and the Duty ratio shown in FIG. 3(f) is less than or equal to the Duty ratio threshold value, the diagnosis necessity determination circuit 110 sets the diagnosis command to H as shown in 3(g). In other cases, the diagnosis necessity determination circuit 110 outputs a diagnosis command to the driver control circuit 108 as L, as shown in FIG. 3(g).

The driver control circuit 108 receives the diagnosis command H shown in FIG. 3(g), shifts to the diagnostic mode at the Fall edge (falling edge) t2 of the PWM command shown in FIG. 3(a), and sets both the high-side FET 102 and the low-side FET 103 to OFF. Then, the driver control circuit 108 outputs the in-diagnosis signal H shown in FIG. 3(h) to the voltage monitor circuit 111.

When the connection state of the synchronous rectifier circuit output terminal 105 is normal, the voltage of the synchronous rectifier circuit output terminal 105 in the diagnostic mode rises to the power supply voltage VB to which the load 106 is connected. The voltage monitor circuit 111 compares the voltage of the synchronous rectifier circuit output terminal 105 in the diagnostic mode with the voltage threshold value. Then, as shown in FIG. 3(e), during a predetermined filter time T, when detected that a state in which the voltage of the synchronous rectifier circuit output terminal 105 is higher than the voltage threshold value is continued, that is, when the voltage monitor circuit 111 detects that the voltage of the synchronous rectifier circuit output terminal 105 is within a predetermined voltage range, the state of the synchronous rectifier circuit output terminal 105 is determined to be normal, and the disconnection diagnostic result B is output as L as shown in FIG. 3(i). The driver control circuit 108 terminates the diagnostic mode at the same time as when the voltage monitor circuit 111 determines that the state of the synchronous rectifier circuit output terminal 105 is normal, and returns to the normal control. That is, when detecting a normal state, the voltage monitor circuit 111 transmits a signal indicating the normal state (L of disconnection diagnostic result B) to the driver control circuit 108, and when receiving a signal indicating a normal operation (L of disconnection diagnostic result B), the driver control circuit 108 resumes the ON/OFF operation of the high-side FET 102 which is the reflux-side switching element and the low-side FET 103 which is the driving-side switching element.

Shift is made to the diagnostic mode at the timing the low-side FET 103, which is the driving-side switching element, switches from ON to OFF, and both the high-side FET 102 and the low-side FET 103 are in the OFF state in the diagnostic mode, so that during this time the reflux current from the inductive load 106 flows through the body diode of the high-side FET 102. At this time, since the resistance becomes larger than in the normal drive in which the high-side FET 102 is turned ON during the reflux, there is a risk that the heat generation may increase and the behavior of the load 106 may be affected the longer the time in which the reflux current flow through the diode. To solve this problem, the filter time T is set so as to be sufficiently shorter than the L period of the PWM, so that as shown in FIG. 3, the normal state is detected in a short time within one cycle, and normal control is returned, and the high-side FET 102 can be turned ON, so that increase in heat generation and influence on the behavior of the load 106 can be reduced.

The filter time T is set to prevent erroneous diagnosis due to noise, and the like and to perform diagnosis more reliably, but the voltage monitor circuit 111 may detect the normal state at a time point the output voltage exceeds the voltage threshold value without providing the filter time T. In this case, the detection of the normal state is completed in a very short period, and the increase of heat generation and the influence on the behavior of the load 106 can be minimized.

A case where the synchronous rectifier circuit output terminal 105 is in the disconnection state at time t3 will be described. The driver control circuit 108 receives the diagnosis command H shown in FIG. 3(g), shifts to the diagnostic mode at the Fall edge t4 of the PWM command shown in FIG. 3(a), and sets both the high-side FET 102 and the low-side FET 103 to OFF. The voltage of the synchronous rectifier circuit output terminal 105 in the diagnostic mode at time t4 becomes the GND potential as shown in FIG. 3(e) to maintain the voltage value when the low-side FET 103 is turned ON immediately before shifting to the diagnostic mode. The voltage monitor circuit 111 detects that a state in which the voltage of the synchronous rectifier circuit output terminal 105 is less than or equal to the voltage threshold value during the filter time is continued during the diagnostic mode, determines the state of the synchronous rectifier circuit output terminal 105 as a disconnection, and outputs the disconnection diagnostic result B shown in FIG. 3(j) as H. As a result, as shown in FIG. 3(k), the OR gate 112 outputs the disconnection diagnostic result C as H as the disconnection state.

As described above, in the present embodiment, the low-side FET 103, which is the driving-side switching element, shifts to the diagnostic mode at the timing of switching from ON to OFF. This is because when turning OFF the FETs on both sides in an attempt to make a diagnosis at the timing the high-side FET 102 is switched from ON to OFF, the voltage of the synchronous rectifier circuit output terminal 105 becomes a voltage close to the power supply voltage VB when it is in a normal state and in a disconnection state, and it becomes difficult to distinguish between normal and disconnection. In order to avoid such a situation, in the present embodiment, the diagnosis is performed when the low-side FET 103 is switched from ON to OFF, so that the diagnosis is performed at the timing the power supply voltage VB is set in the normal state and the GND voltage is set in the disconnection state, thus making it easy to distinguish between disconnection and normal.

According to the present embodiment, the disconnection diagnosis during the diagnostic mode performed by turning OFF both the high-side FET 102 and the low-side FET 103 determines the disconnection state and the normal state of the synchronous rectifier circuit output terminal 105 based on the voltage value of the synchronous rectifier circuit output terminal 105, and thus it does not depend on the magnitude of the current flowing through the synchronous rectifier circuit 104. Therefore, the current flowing through the synchronous rectifier circuit 104 does not meet the accuracy of the current detection circuit 109, and detection of disconnection can be reliably carried out even at the time of driving at low Duty or low power supply voltage when there is a possibility the disconnection may be erroneously detected with only the current detection result.

In FIG. 3, the diagnostic mode continues even after the voltage monitor circuit 111 detects the disconnection, but immediately after the disconnection is detected, the Rise edge (rising edge) t5 of the PWM command, and the like may be returned to the normal control at an arbitrary timing after the disconnection is detected.

Furthermore, when a normal state or disconnection is detected, the diagnosis command is set to L at the same time as returning from the diagnostic mode to the normal control, and thereafter a state in which the current detection result is lower than or equal to the current threshold value and the Duty ratio is lower than or equal to the Duty ratio threshold value is continued for a constant cycle, the diagnosis command may be set to H again and the mode may be shifted to the diagnostic mode. Thus, the diagnosis frequency can be adjusted as necessary and the increase in heat generation and the influence on the behavior of the load 106 can be further reduced.

In FIG. 1, the input of the diagnosis necessity determination circuit 110 is the Duty ratio and the current detection result, but this is to shift to the diagnostic mode only when the current flowing through the synchronous rectifier circuit 104 becomes small. As another example, the diagnosis necessity determination circuit 110 may use the power supply voltage VB of the synchronous rectifier circuit 104 as an input instead of the Duty ratio as a reference for determining the magnitude of the current that should flow to the synchronous rectifier circuit 104, and may output the diagnosis command when the input power supply voltage VB of the synchronous rectifier circuit 104 is less than or equal to a predetermined voltage threshold value. Furthermore, as another example, the diagnosis necessity determination circuit 110 may use the power supply voltage VB of the synchronous rectifier circuit 104 as an input instead of the Duty ratio as a reference for determining the magnitude of the current that should flow to the synchronous rectifier circuit 104, and may output the diagnosis command when the current detection result from the current detection circuit 109 is less than or equal to a predetermined current and the input power supply voltage VB of the synchronous rectifier circuit 104 is less than or equal to a predetermined voltage. As yet another example, the diagnosis necessity determination circuit 110 may use a product of the Duty ratio and the power supply voltage VB of the synchronous rectifier circuit 104 as an input instead of the Duty ratio as a reference for determining the magnitude of the current that should flow to the synchronous rectifier circuit 104, and may output the diagnosis command when the current detection result from the current detection circuit 109 is less than or equal to a predetermined current and the product of the input Duty ratio of the synchronous rectifier circuit 104 and the input power supply voltage VB of the synchronous rectifier circuit 104 is less than or equal to a predetermined product. Moreover, the diagnosis necessity determination circuit 110 may use only one of the current detection result, the Duty ratio, the power supply voltage VB, or the product of the Duty ratio and the power supply voltage VB as the determination reference of the diagnosis command output. Alternatively, the diagnosis command may be output as H at every constant cycle of the PWM command or at every fixed time without providing the determination reference related to the current value flowing through the synchronous rectifier circuit 104.

Second Embodiment

Figure 4:
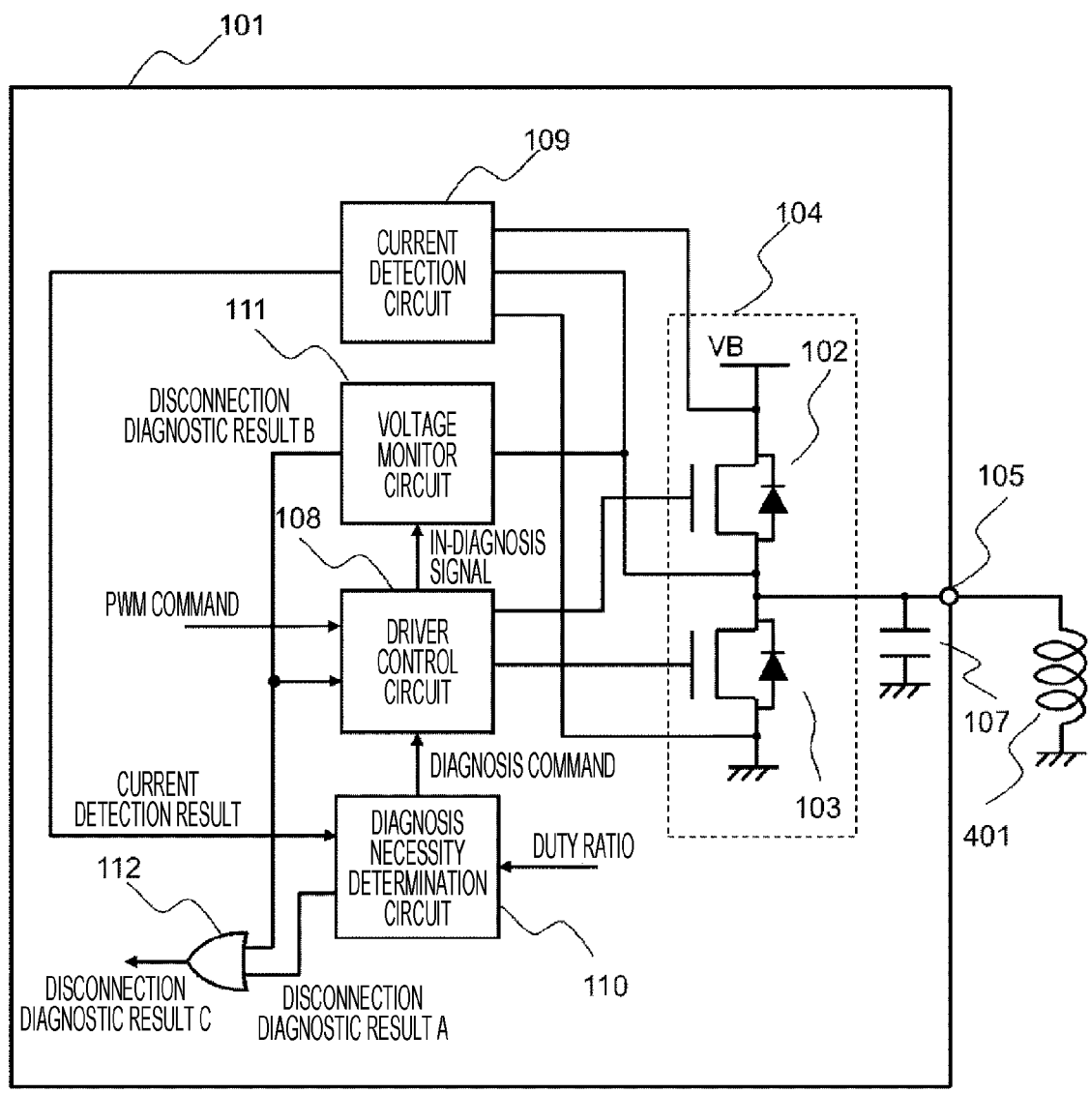
FIG. 4 is a circuit configuration diagram in a second embodiment.

FIG. 4 is a circuit configuration diagram in a second embodiment. The present embodiment is different from the first embodiment in the configuration of a load 401. The same reference numerals are denoted on the components common with those of the first embodiment, and the description thereof will be omitted.

In the present embodiment, a synchronous rectifier circuit 104 has a high-side configuration in which the load 401 is connected to GND, a high-side FET 102 operates as a driving-side switching element, and a low-side FET 103 operates as a reflux-side switching element. Other configurations are the same as those of the first embodiment, and the parts different from the first embodiment will be centrally described in the following description.

Figure 5:
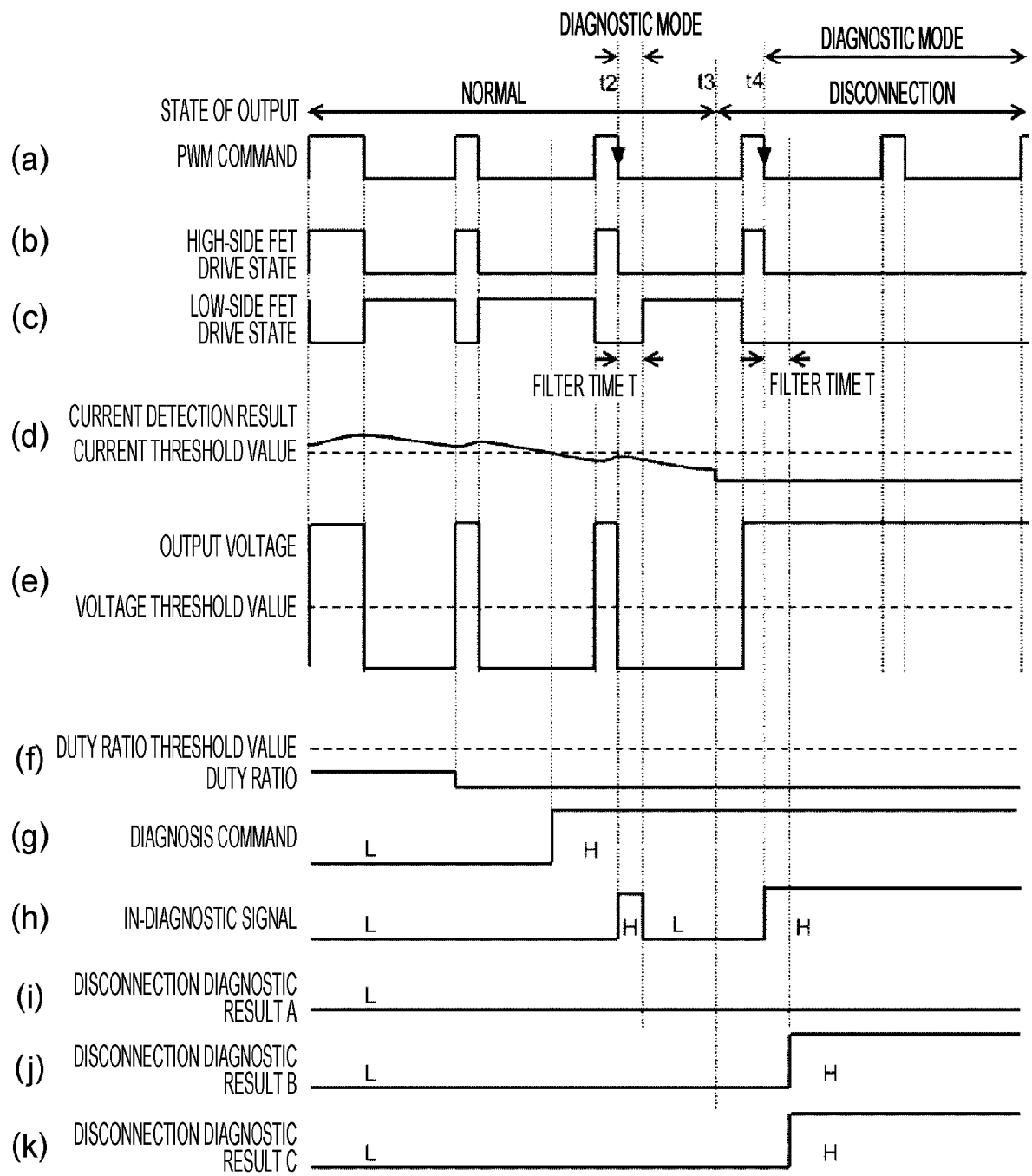
FIG. 5 is a timing chart showing an example of the operation of the second embodiment.

FIG. 5 is a timing chart showing an example of the operation of the present embodiment. Since the synchronous rectifier circuit 104 has a high-side configuration, in the normal control, when the PWM command shown in FIG. 5(a) is H, the high-side FET 102 shown in FIG. 5(b) is set to ON, and the low-side FET 103 shown in FIG. 5(c) is set to OFF. Furthermore, when the PWM command shown in FIG. 5(a) is L, the high-side FET 102 shown in FIG. 5(b) is set to OFF and the low-side FET 103 shown in FIG. 5(c) is set to ON.

In the present embodiment, the condition relating to the voltage of the synchronous rectifier circuit output terminal 105 for the voltage monitor circuit 111 to determine the normal state and the disconnection state of the synchronous rectifier circuit output terminal 105 is different from that of the first embodiment.

When the state of the synchronous rectifier circuit output terminal 105 is normal, the voltage of the synchronous rectifier circuit output terminal 105 during the diagnostic mode in the filter time T starting from time t2 lowers to the GND potential, which is the destination to which the load 401 is connected, as shown in FIG. 5(e). Therefore, when the voltage of the synchronous rectifier circuit output terminal 105 during the diagnostic mode is lower than the voltage threshold value, the voltage monitor circuit 111 determines that the state of the synchronous rectifier circuit output terminal 105 is normal and outputs the disconnection diagnostic result B shown in FIG. 5(j) as L.

A case where the synchronous rectifier circuit output terminal 105 is in the disconnection state at time t3 will be described. The driver control circuit 108 receives the diagnosis command H shown in FIG. 5(g), shifts to the diagnostic mode at the Fall edge t4 of the PWM command shown in FIG. 5(a), and sets both the high-side FET 102 and the low-side FET 103 to OFF. The voltage of the synchronous rectifier circuit output terminal 105 in the diagnostic mode at time t4 becomes the power supply voltage VB as shown in FIG. 5(e) to maintain the voltage value when the high-side FET 102 is turned ON immediately before shifting to the diagnostic mode. Therefore, when the voltage of the synchronous rectifier circuit output terminal 105 is greater than or equal to the voltage threshold value, the voltage monitor circuit 111 determines that the state of the synchronous rectifier circuit output terminal 105 is disconnection, and outputs the disconnection diagnostic result B shown in FIG. 5(j) as H. As a result, as shown in FIG. 5(k), the OR gate 112 outputs the disconnection diagnostic result C as H as the disconnection state.

As described in the first and second embodiments, when the voltage of the synchronous rectifier circuit output terminal 105 in the diagnostic mode is higher than the threshold value voltage in the low-side configuration, determination is made as normal when the voltage is lower than the threshold value voltage in the high-side configuration, and hence whether the synchronous rectifier circuit output terminal 105 is normal state or disconnection state can be determined regardless of whether the synchronous rectifier circuit 104 has the low-side configuration or the high-side configuration, by changing the determination condition of the monitor circuit 21.

Third Embodiment

Figure 6:
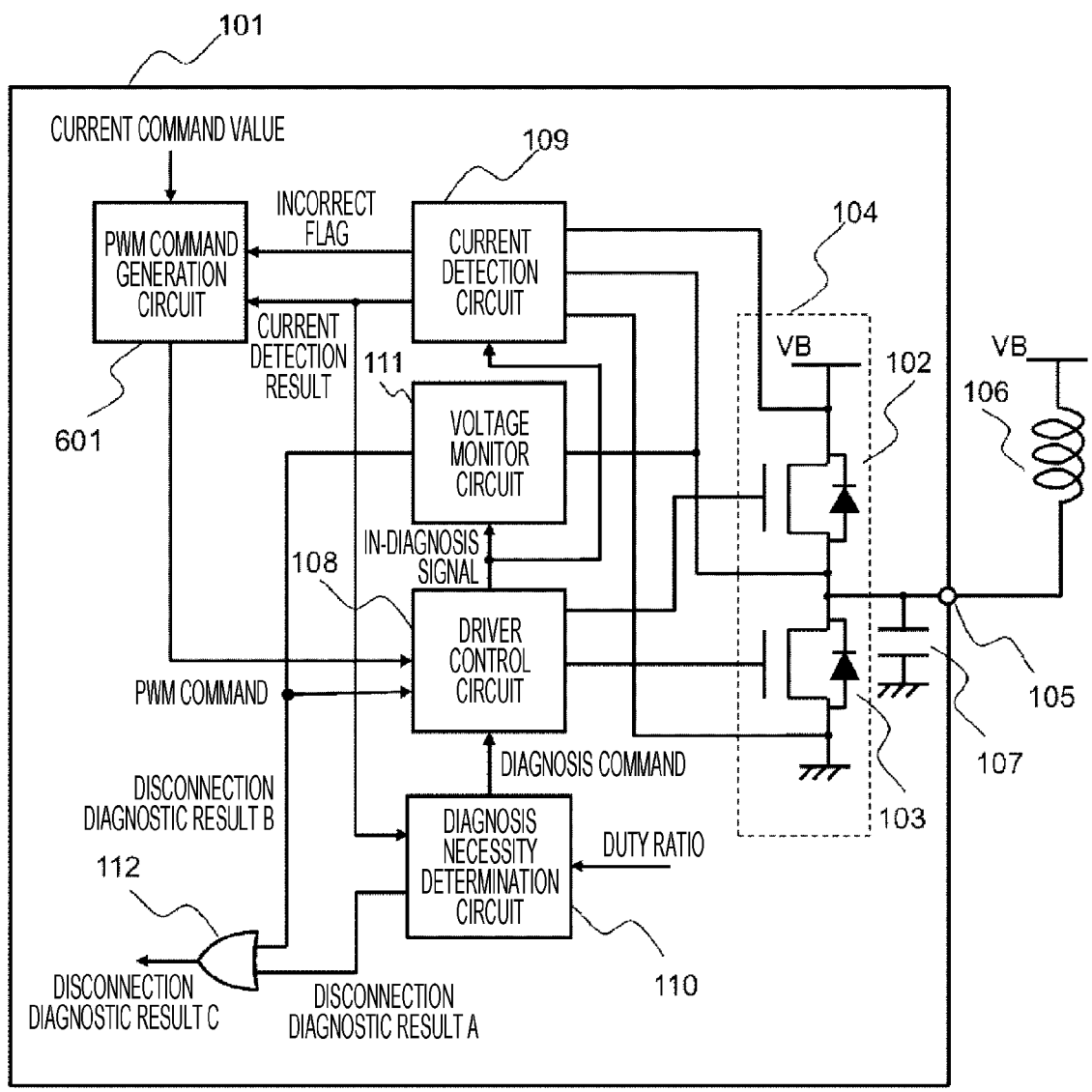
FIG. 6 is a circuit configuration diagram in a third embodiment.

FIG. 6 is a circuit configuration diagram in a third embodiment. The present embodiment is different from the first embodiment in the configuration of the input/output signals of the PWM command generation circuit 601 and the current detection circuit 109. The same reference numerals are denoted on the components common with those of the first embodiment, and the description thereof will be omitted.

The current detection circuit 109 receives the in-diagnosis signal from the driver control circuit 108 as an input, and outputs a current detection result and an incorrect signal indicating that the current detection result is inaccurate to the PWM command generation circuit 601.

The PWM command generation circuit 601 receives the current detection result, the incorrect signal, and the current command value as inputs, and generates the PWM command so that the current flowing through the synchronous rectifier circuit 104 becomes equal to the current command value. That is, the PWM command generation circuit 601 generates the PWM command to be equal to the current command value based on the current detection result from the current detection circuit 109 when the incorrect signal is L (indicating that the current detection result is accurate). Furthermore, the PWM command generation circuit 601 ignores the current detection result from the current detection circuit 109 and generates the PWM command to be equal to the current command value based on the current value before the incorrect signal becomes H when the incorrect signal is H (indicating that the current detection result is inaccurate).

Figure 7:
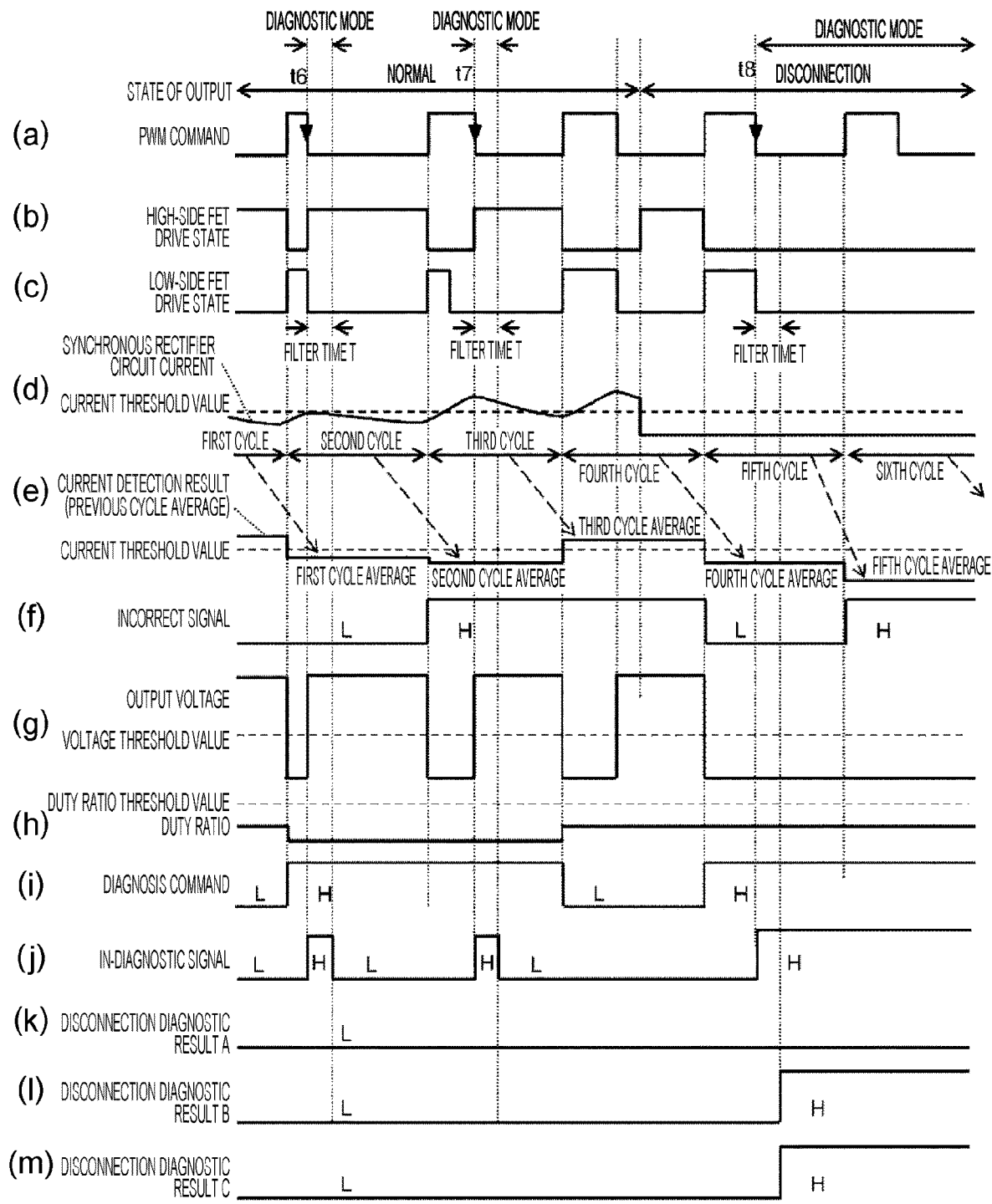
FIG. 7 is a timing chart showing an example of the operation of the third embodiment.

FIG. 7 is a timing chart showing an example of the operation of the present embodiment. The current detection circuit 109 calculates the average value of the current (synchronous rectifier circuit current) shown in FIG. 7(d) flowing through the synchronous rectifier circuit 104 for one cycle from the Rise edge of the PWM command to the next Rise edge, and outputs the calculation result in the next cycle as the current detection result shown in FIG. 7(e). Therefore, the average current value of each cycle is output one cycle later, such as the average current value of the first cycle in FIG. 7 is output in the period of the second cycle, the average current value of the second cycle is output in the period of the third cycle, and so on.

There is a method of obtaining the current from the source-drain voltage of the high-side FET 102 and the low-side FET 103 and the respective ON resistances as a means of detecting the current of the synchronous rectifier circuit 104, in which case, the current cannot be detected correctly when either one of the high-side FET 102 and the low-side FET 103 is not turned ON. Therefore, the current detection result detected during the diagnostic mode period in which both the high-side FET 102 and the low-side FET 103 are turned OFF becomes inaccurate.

The current detection circuit 109 thus detects a cycle including the diagnostic mode period from the in-diagnosis signal shown in FIG. 7(j), and outputs the incorrect signal shown in FIG. 7(f) as H while the average current during that period is output to notify the PWM command generation circuit 601 that the current detection result is inaccurate.

Specifically, the diagnostic mode period is included in the second cycle, the third cycle, the fifth cycle, and the sixth cycle as shown in FIG. 7(d), and the incorrect signal shown in FIG. 7(f) is set to H during a period of one cycle later in which each average current value is output. Although the period in which the sixth cycle average is output is not shown in FIG. 7, the incorrect signal is also H during this period.

The diagnosis necessity determination circuit 110 compares the current detection result shown in FIG. 7(e) with the current threshold value, and outputs the diagnosis command shown in FIG. 7(i) to the driver control circuit 108.

In response to this, the driver control circuit 108 outputs the in-diagnosis signal shown in FIG. 7(j) to the voltage monitor circuit 111 and the current detection circuit 109. At the filter time T starting from time t6, the incorrect signal shown in FIG. 7(f) is L. On the other hand, since the detection value of the output voltage by the voltage monitor circuit 111 shown in FIG. 7(g) is H, the disconnection diagnostic result B shown in FIG. 7(l) is L.

Next, at the filter time T starting from time t7, the incorrect signal shown in FIG. 7(f) is H, and thus notification is made to the PWM command generation circuit 601 that the current detection result is inaccurate. Since the detection value of the output voltage by the voltage monitor circuit 111 shown in FIG. 7(g) is H, the disconnection diagnostic result B shown in FIG. 7(l) is L.

At the filter time T starting from time t8, the incorrect signal shown in FIG. 7(f) is L. On the other hand, since the detection value of the output voltage by the voltage monitor circuit 111 is L, the disconnection diagnostic result B shown in FIG. 7(l) becomes H, and the disconnection is detected.

Thus, as notification is made to the PWM command generation circuit 601 that the current detection result is inaccurate by the detection of disconnection during the diagnostic mode, the PWM command can be avoided from being generated based on an incorrect current detection result.

In the present embodiment, the current detection result is the average value of the previous PWM cycle, but when the current of the synchronous rectifier circuit 104 is output as the current detection result in real time as in the first and second embodiments, the in-diagnosis signal can also be treated as an incorrect signal.

Fourth Embodiment

Figure 8:
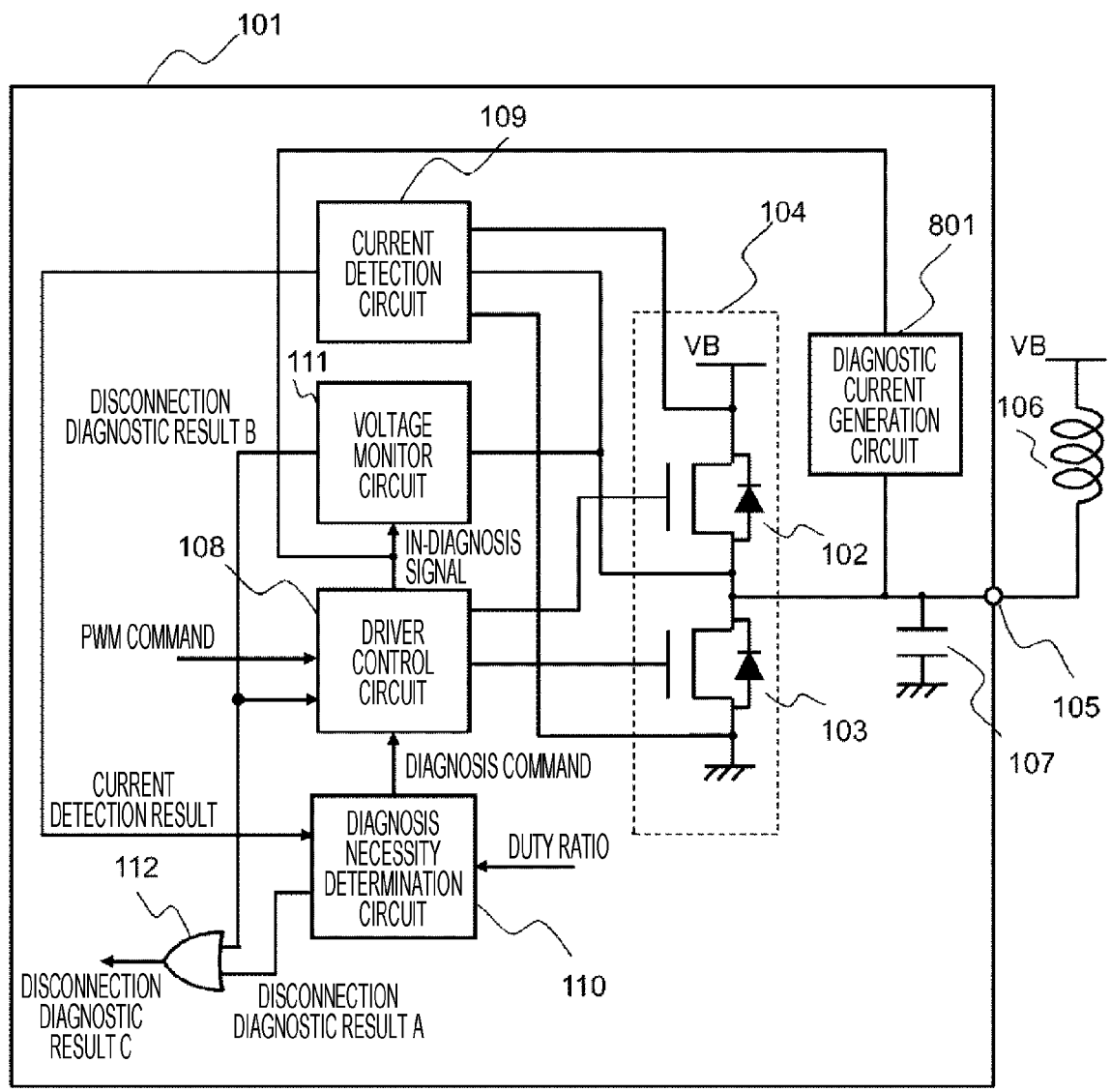
FIG. 8 is a circuit configuration diagram in a fourth embodiment.

FIG. 8 is a circuit configuration diagram in a fourth embodiment. The present embodiment is different from the first embodiment in the configuration of the diagnostic current generation circuit 801. The same reference numerals are denoted on the components common with those of the first embodiment, and the description thereof will be omitted.

As shown in FIG. 8, the in-diagnostic control signal is input from the driver control circuit 108 to the diagnostic current generation circuit 801. The diagnostic current generation circuit 801 is connected to the synchronous rectifier circuit output terminal 105.

Figure 9:
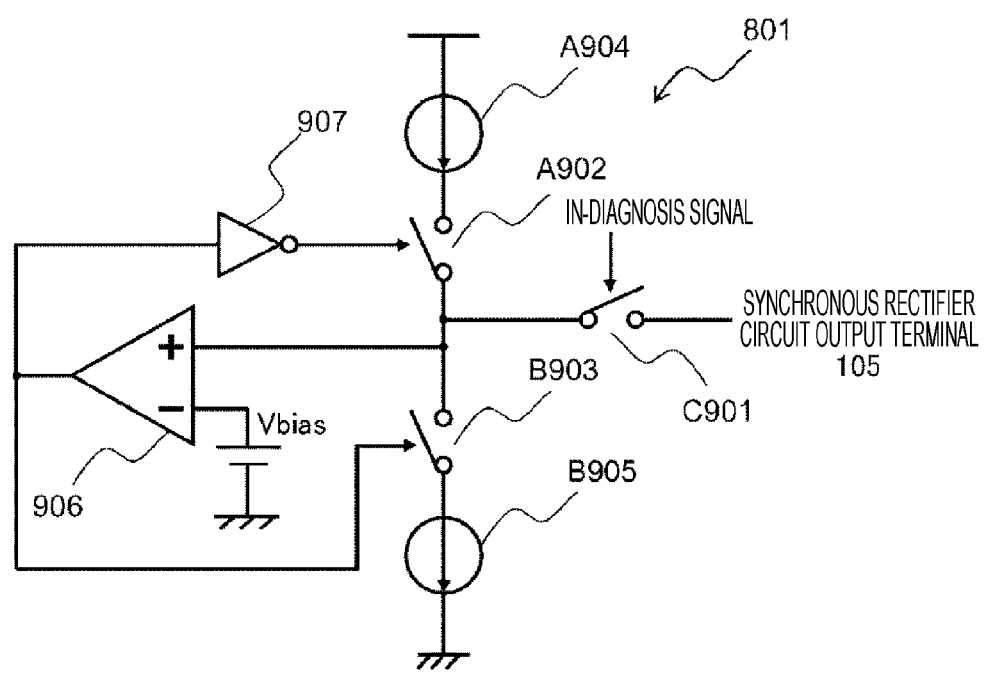
FIG. 9 is a circuit configuration diagram of a diagnostic current generation circuit.

FIG. 9 is a circuit configuration diagram of the diagnostic current generation circuit 801. The diagnostic current generation circuit 801 is activated by being connected to the synchronous rectifier circuit output terminal 105 by a switch C901 when the in-diagnosis signal is H, that is, in the diagnostic mode. The synchronous rectifier circuit output terminal 105 is connected to the current source A904 and the current source B905 through a switch A902 and a switch B903, respectively. The comparator 906 compares the voltage of the synchronous rectifier circuit output terminal 105 with the voltage Vbias, and outputs H when the synchronous rectifier circuit output terminal 105 is higher than Vbias and outputs L when it is lower than Vbias. The output of the comparator 906 is input to the switch A902 through the inverter 907 and directly input to the switch B903. When the output of the comparator 906 is H, that is, when the synchronous rectifier circuit output terminal 105 is higher than Vbias, the switch A902 is turned OFF and the switch B903 is turned ON, and the output of the comparator 906 is L, that is, when the synchronous rectifier circuit output terminal 105 is lower than Vbias, the switch A902 is turned ON and the switch B903 is turned OFF.

The current source A904 outflows the diagnostic current toward the synchronous rectifier circuit output terminal 105 and charges the terminal capacitor 107 while the switch A902 is turned ON and the switch C901 is turned ON. Furthermore, the current source B905 draws the diagnostic current from the synchronous rectifier circuit output terminal 105 and extracts the electric charge of the terminal capacitor 107 while the switch B903 is turned ON and the switch C901 is turned ON. Thus, the diagnostic current generation circuit 801 charges and discharges the terminal capacitor 107 with the diagnostic current during the diagnostic mode, and controls the voltage of the synchronous rectifier circuit output terminal 105 to Vbias.

At this time, in order to prevent the diagnostic current from affecting the operation of the load 106, it is set sufficiently smaller than the drive current of the load 106. Furthermore, this makes it possible to sufficiently reduce the voltage drop at the load 106 due to the diagnostic current even when the load 106 is normally connected, and the voltage of the synchronous rectifier circuit output terminal 105 during the diagnostic mode does not become Vbias and rises to near the power supply voltage VB when the state of the synchronous rectifier circuit output terminal 105 is normal. On the other hand, when the synchronous rectifier circuit output terminal 105 is disconnected, the voltage of the synchronous rectifier circuit output terminal 105 is lifted to Vbias by the diagnostic current. At this time, Vbias needs to be set between the voltage threshold value and the GND potential.

Figure 10:
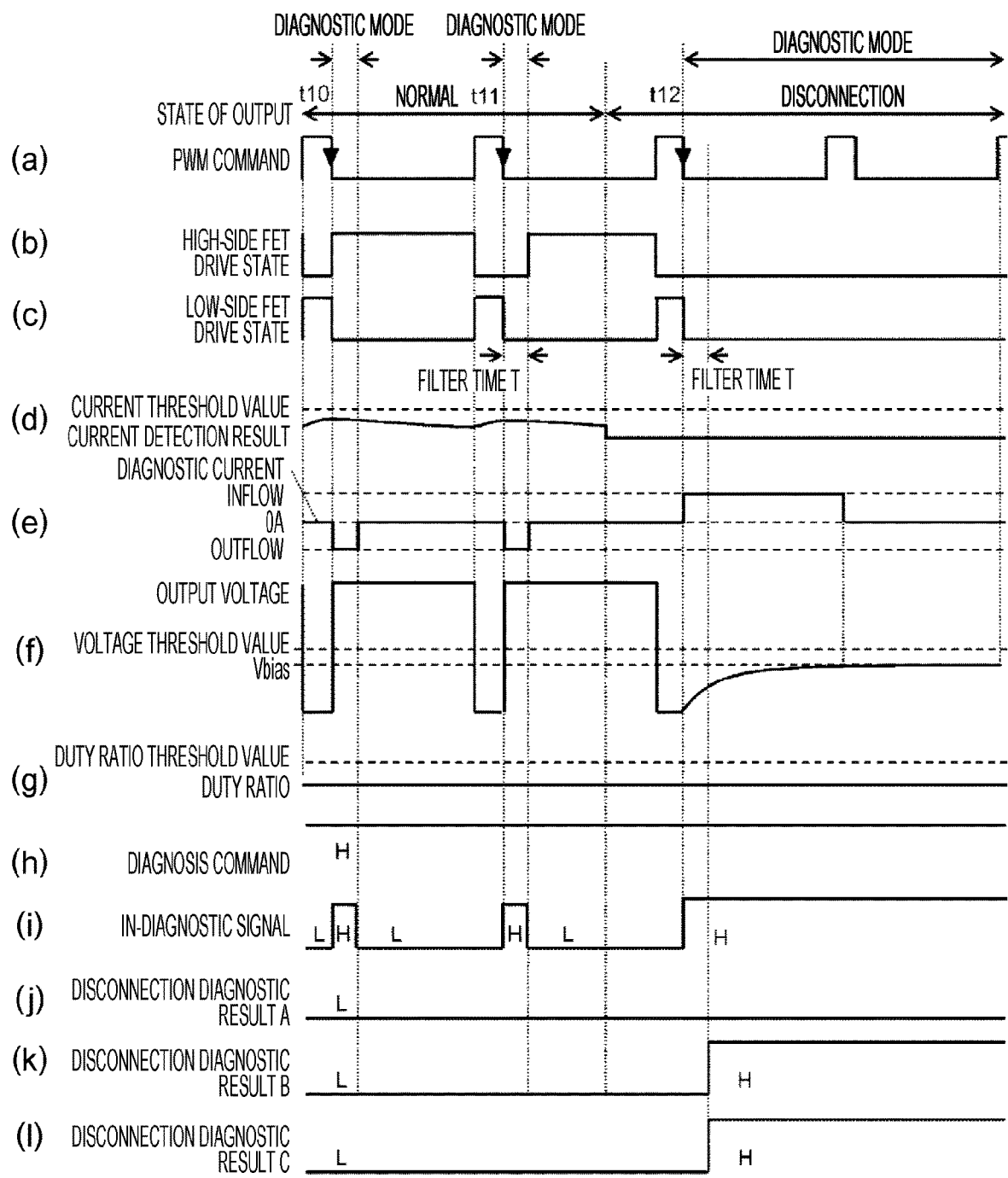
FIG. 10 is a timing chart showing an example of the operation of the fourth embodiment.

FIG. 10 is a timing chart showing an example of the operation of the present embodiment. When the connection state of the synchronous rectifier circuit output terminal 105 is normal, at times t10 and t11, if the diagnostic current is set to be sufficiently small as described above, the voltage of the synchronous rectifier circuit output terminal 105 during the diagnostic mode is, as shown in FIG. 10(f), higher than Vbias, and the diagnostic current shown in FIG. 10(e) is drawn from the synchronous rectifier circuit output terminal 105, but the voltage of the synchronous rectifier circuit output terminal 105 shown in FIG. 10(f) rises to near the power supply voltage VB.

When the synchronous rectifier circuit output terminal 105 is in the disconnection state, at time t12 immediately after the shift to the diagnostic mode, the voltage of the synchronous rectifier circuit output terminal 105 is, as shown in FIG. 10(f), GND, and thus the diagnostic current shown in FIG. 10(e) is flowed into the synchronous rectifier circuit output terminal 105, and the voltage of the synchronous rectifier circuit output terminal 105 is lifted up to Vbias as shown in FIG. 10(f). When the voltage at the synchronous rectifier circuit output terminal 105 reaches Vbias, the diagnostic current shown in FIG. 10(e) is in equilibrium on the outflow side and the drawing side, and thus becomes 0 A in total.

The voltage monitor circuit 111 detects that a state in which the voltage of the synchronous rectifier circuit output terminal 105 is less than or equal to the voltage threshold value during the filter time is continued, determines the state of the synchronous rectifier circuit output terminal 105 as disconnection, and outputs the disconnection diagnostic result B shown in FIG. 10(k) as H. As a result, as shown in FIG. 10(l), the OR gate 112 outputs the disconnection diagnostic result C as H as the disconnection state.

As described above, the diagnostic current generation circuit 801 controls the voltage of the synchronous rectifier circuit output terminal 105 in the diagnostic mode to enable a more stable diagnosis. For example, when the voltage of the synchronous rectifier circuit output terminal 105 becomes greater than or equal to the voltage threshold value due to the disturbance noise despite the disconnection state, erroneous normal state determination can be prevented by drawing the diagnostic current and lowering the voltage of the synchronous rectifier circuit output terminal 105 within the filter time.

Furthermore, a case where the resistance between the synchronous rectifier circuit output terminal 105 and the power supply voltage VB of the load 106 becomes high when the synchronous rectifier circuit output terminal 105 is about to be disconnected can be detected as the disconnection state by using the present embodiment. Specifically, assuming the resistance value between the synchronous rectifier circuit output terminal 105 and the power source of the load 106 to be desirably detected as a disconnection state is R and the diagnostic current to be drawn is I, the voltage of the synchronous rectifier circuit output terminal 105 is VB−I×R. The resistance value R can be detected as a disconnection state by setting the value of the diagnostic current I so that the voltage value becomes less than the voltage threshold value.

In the fourth embodiment shown in FIGS. 8 to 10, the low-side configuration in which the load 106 is connected to the power supply voltage VB has been described as an example, but the high-side configuration may be used. Even in the case of the high-side configuration, a stable diagnosis and a state of about to disconnect can be detected. However, the value of Vbias at this time must be set between the voltage threshold value and the power supply voltage VB.

Fifth Embodiment

Figure 11:
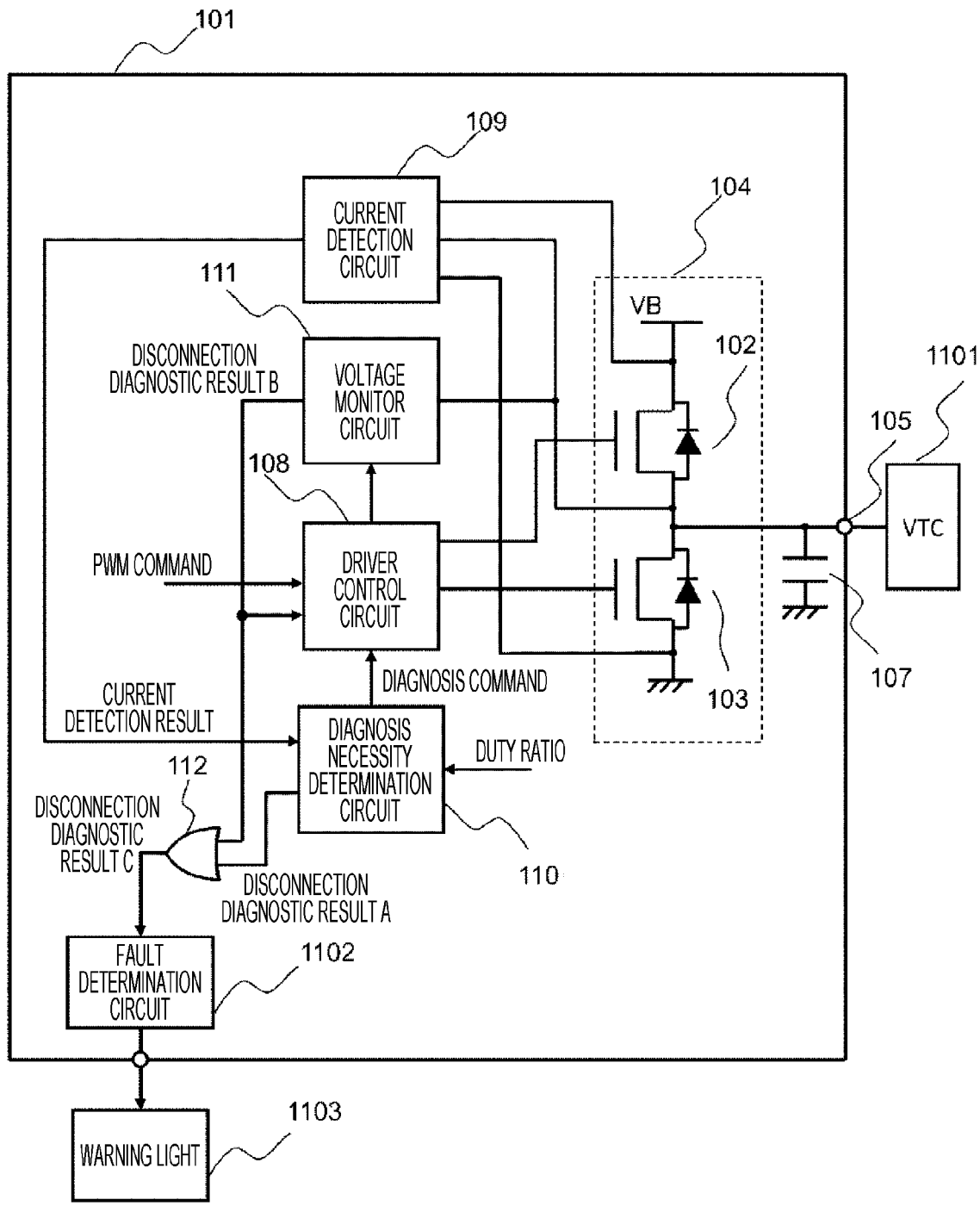
FIG. 11 is a circuit configuration diagram in a fifth embodiment.

FIG. 11 is a circuit configuration diagram in a fifth embodiment. The present embodiment is different from the first embodiment in the configuration of a valve timing control system (VTC: Valve Timing Control System) 1101 of an engine, a fault determination circuit 1102, and a warning light 1103. The same reference numerals are denoted on the components common with those of the first embodiment, and the description thereof will be omitted.

In the present embodiment, the load driving device 101 is mounted on an automobile and drives a solenoid valve incorporated in the VTC 1101 to control the VTC 1101.

The VTC1101 plays the role of continuously changing the valve timing of the engine according to the operation conditions such as rotation number of the engine, temperature, load, and the like, so that an optimum valve timing is obtained in the entire operating region, whereby air pollutants in the exhaust gas exhausted from the engine can be reduced and fuel consumption and engine output/performance can be improved.

When the disconnection diagnostic result C is H, the fault determination circuit 1102 lights the warning light 1103 to notify the user of the disconnection of the VTC 1101. At this time, the fault determination circuit 1102 determines that the VTC 1101 is definitely disconnected, and can make a more reliable warning by lighting the warning light 1103, and the like for example, only when H of the disconnection diagnostic result C is continuously detected for a certain period.

As in the present embodiment, the disconnection diagnosis can be made in the entire operating region from the high Duty ratio to the low Duty ratio by applying to the VTC 1101 the disconnection diagnosis performed by turning OFF both the high-side FET 102 and the low-side FET 103 during the diagnostic mode, and furthermore, the disconnection diagnosis can be reliably performed while suppressing the influence on the operation of the VTC 1101 even in the operating region where the drive current of the VTC 1101 becomes small, so that increase in air pollutants in the exhaust gas by disconnection diagnosis and deterioration of fuel consumption and engine output/performance can be reduced.

The embodiment described above has the following operation effect.

(1) The load driving device 101 includes a synchronous rectifier circuit 104 having a driving-side switching element (high-side FET 102 or low-side FET 103) and a reflux-side switching element (low-side FET 103 or high-side FET 102); a driver control circuit 108 that controls the synchronous rectifier circuit 104: and a voltage monitor circuit 111 that monitors the voltage of an output terminal of the synchronous rectifier circuit 104; where the driver control circuit 108, upon receiving a diagnosis command, performs control so that when the driving-side switching element is switched from ON to OFF, the reflux-side switching element is also switched to OFF; and the voltage monitor circuit 111 detects a normal state when the voltage to be monitored is within a predetermined voltage range during a period in which both the driving-side switching element and the reflux-side switching element are turned OFF. Accordingly, whether the output side of the synchronous rectifier circuit is in a disconnection state or a normal state can be detected in a short time during driving with a low load current.

The present invention is not limited to the embodiments described above, and other modes conceivable within the scope of the technical idea of the present invention are also included in the scope of the present invention as long as the characteristics of the present invention are not impaired. Furthermore, the embodiments described above may be combined.

REFERENCE SIGNS LIST 101 load driving device
102 high-side FET
103 low-side FET
104 synchronous rectifier circuit
105 synchronous rectifier circuit output terminal
106 load
107 terminal capacitor
108 driver control circuit
109 current detection circuit
110 diagnosis necessity determination circuit
111 voltage monitor circuit
112 OR gate
401 load 601 PWM command generation circuit
801 diagnostic current generation circuit
901 switch
C902 switch
A903 switch
B904 current source
A905 current source
B906 comparator
907 inverter
1101 VTC (Valve Timing Control System)
1102 fault determination circuit
1103 warning light

The invention claimed is:

1. A load driving device comprising a synchronous rectifier circuit having a driving-side switching element and a reflux-side switching element; a driver control circuit that controls the synchronous rectifier circuit; and a voltage monitor circuit that monitors the voltage of an output terminal of the synchronous rectifier circuit; wherein the driver control circuit, upon receiving a diagnosis command, performs control so that when the driving-side switching element is switched from ON to OFF, the reflux-side switching element is also switched to OFF; and the voltage monitor circuit detects a normal state when the voltage to be monitored is within a predetermined voltage range during a period in which both the driving-side switching element and the reflux-side switching element are turned OFF.

2. The load driving device according to claim 1, wherein the voltage monitor circuit transmits a signal indicating a normal state to the driver control circuit when a normal state is detected, and the driver control circuit resumes ON/OFF operation of the reflux-side switching element and the driving-side switching element when a signal indicating the normal state is received.

3. The load driving device according to claim 2, wherein the voltage monitor circuit determines as a normal state when the voltage of the output terminal is within the predetermined voltage range during a predetermined filter time.

4. The load driving device according to claim 3, further comprising a current detection circuit that detects a current flowing through the synchronous rectifier circuit, and a diagnosis necessity determination circuit that outputs the diagnosis command to the driver control circuit when the current detection result from the current detection circuit is less than or equal to a predetermined value.

5. The load driving device according to claim 3, further comprising a diagnosis necessity determination circuit that outputs the diagnosis command to the driver control circuit when an input Duty ratio of the synchronous rectifier circuit is less than or equal to a predetermined Duty ratio.

6. The load driving device according to claim 3, further comprising a diagnosis necessity determination circuit that outputs the diagnosis command when an input power supply voltage of the synchronous rectifier circuit is less than or equal to a predetermined power supply voltage threshold value.

7. The load driving device according to claim 4, wherein the diagnosis necessity determination circuit outputs the diagnosis command when the current detection result from the current detection circuit is less than or equal to a predetermined current and the input Duty ratio of the synchronous rectifier circuit is less than or equal to a predetermined Duty ratio.

8. The load driving device according to claim 4, wherein the diagnosis necessity determination circuit outputs the diagnosis command when the current detection result from the current detection circuit is less than or equal to a predetermined current and the input power supply voltage of the synchronous rectifier circuit is less than or equal to a predetermined voltage.

9. The load driving device according to claim 4, wherein the diagnosis necessity determination circuit outputs the diagnosis command when the current detection result from the current detection circuit is less than or equal to a predetermined current and a product of the input Duty ratio of the synchronous rectifier circuit and the input power supply voltage of the synchronous rectifier circuit is less than or equal to a predetermined product.

10. The load driving device according to claim 4, further comprising a PWM command generation circuit that generates a PWM command so that the current of the synchronous rectifier circuit becomes equal to the input current command value based on the current detection result and an incorrect signal indicating that the current detection result is inaccurate, and outputs the generated PWM command to the driver control circuit; wherein
the current detection circuit outputs the incorrect signal to the PWM command generation circuit when the current value detected in a period including a period in which the driving-side switching element and the reflux-side switching element are both turned OFF in response to receiving the diagnosis command is output.

11. The load driving device according to claim 1, wherein the output terminal is connected to a diagnostic current generation circuit, and the diagnostic current generation circuit adjusts the voltage of the output terminal to a predetermined voltage by flowing a current corresponding to the voltage of the output terminal during disconnection diagnosis.

12. The load driving device according to claim 1, wherein the load driving device drives a solenoid valve incorporated in a valve timing control system as a load.

13. The load driving device according to claim 12, further comprising a warning device that warns of a fault of the solenoid valve when the voltage monitor circuit does not detect the normal state.

* * * * *